United States Patent
Sekiya

(10) Patent No.: US 10,532,445 B2
(45) Date of Patent: Jan. 14, 2020

(54) PROCESSING APPARATUS AND PROCESSING METHOD FOR WORKPIECE

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 198 days.

(21) Appl. No.: 15/730,231

(22) Filed: Oct. 11, 2017

(65) Prior Publication Data

US 2018/0099377 A1 Apr. 12, 2018

(30) Foreign Application Priority Data

Oct. 12, 2016 (JP) .................. 2016-201093

(51) Int. Cl.
| | | |
|---|---|---|
| *B24B 53/02* | (2012.01) | |
| *B24B 37/005* | (2012.01) | |
| *B24B 37/10* | (2012.01) | |
| *B24B 49/18* | (2006.01) | |
| *B24B 53/12* | (2006.01) | |
| *B24D 7/16* | (2006.01) | |
| *H01L 21/02* | (2006.01) | |
| *H01L 21/67* | (2006.01) | |

(52) U.S. Cl.
CPC ............ *B24B 53/02* (2013.01); *B24B 37/005* (2013.01); *B24B 37/10* (2013.01); *B24B 49/18* (2013.01); *B24B 53/12* (2013.01); *B24D 7/16* (2013.01); *H01L 21/02013* (2013.01); *H01L 21/67092* (2013.01)

(58) Field of Classification Search
CPC ......... B24B 7/04; B24B 37/005; B24B 37/04; B24B 37/042; B24B 37/10; B24B 37/105; B24B 49/18; B24B 53/02; B24B 53/017; B24B 53/12; H01L 21/02013; H01L 21/67092; H01L 21/6838; B25B 11/005
USPC ......... 451/5, 11, 41, 56, 287, 289, 290, 388, 451/443
See application file for complete search history.

(56) References Cited

U.S. PATENT DOCUMENTS 7,129,110 B1 * 10/2006 Shibata ................... H01L 21/56
 438/106
2002/0042154 A1 * 4/2002 Nakabayashi .......... H01L 22/12
 438/14

(Continued)

FOREIGN PATENT DOCUMENTS

JP 2009-142906 7/2009

*Primary Examiner* — Eileen P Morgan
(74) *Attorney, Agent, or Firm* — Greer Burns & Crain, Ltd.

(57) ABSTRACT

A processing apparatus includes a chuck table that holds a workpiece by a holding face, a processing unit that processes the workpiece with a grinding whetstone or a polishing pad, a movement unit for moving the chuck table and the processing unit parallel to the holding face, a processing feeding unit for moving the chuck table and the processing unit in a direction orthogonal to the holding face, an inspection unit to inspect a process mark of the workpiece during processing, a dressing unit to dress the grinding whetstone or the polishing pad of the processing unit, and a control unit. When a process mark of a size exceeding a threshold value is detected on the process face of the workpiece, the control unit stops processing of the workpiece, and after the grinding whetstone or the polishing pad is dressed, restarts processing.

12 Claims, 6 Drawing Sheets

(56) References Cited

U.S. PATENT DOCUMENTS

| | | | |
|---|---|---|---|
| 2002/0137431 A1* | 9/2002 | Labunsky | B24B 37/042 |
| | | | 451/6 |
| 2004/0162688 A1* | 8/2004 | Eaton | B24B 37/04 |
| | | | 702/100 |
| 2006/0084365 A1* | 4/2006 | Sakurai | B24B 7/04 |
| | | | 451/41 |
| 2006/0240749 A1* | 10/2006 | Yun | B24B 37/26 |
| | | | 451/41 |
| 2009/0042480 A1* | 2/2009 | Shiro | B24B 37/205 |
| | | | 451/6 |
| 2009/0301518 A1* | 12/2009 | Oikawa | B08B 3/02 |
| | | | 134/1.3 |
| 2009/0305615 A1* | 12/2009 | Uchiyama | B24B 37/28 |
| | | | 451/57 |
| 2012/0003816 A1* | 1/2012 | Shimotani | H01L 21/78 |
| | | | 438/462 |
| 2014/0242894 A1* | 8/2014 | Itoyama | B24B 37/24 |
| | | | 451/548 |
| 2015/0158143 A1* | 6/2015 | Lee | B24B 53/017 |
| | | | 156/345.12 |
| 2016/0346899 A1* | 12/2016 | Lai | B24B 49/105 |
| 2018/0056476 A1* | 3/2018 | Zhang | B24B 37/005 |
| 2018/0151384 A1* | 5/2018 | Zhang | H01L 21/3212 |
| 2019/0143474 A1* | 5/2019 | Wang | B24B 37/0053 |
| | | | 438/5 |
| 2019/0143475 A1* | 5/2019 | Dhandapani | B24B 37/013 |
| 2019/0152016 A1* | 5/2019 | Wei | B24B 37/20 |

* cited by examiner

PROCESSING APPARATUS AND PROCESSING METHOD FOR WORKPIECE

BACKGROUND OF THE INVENTION

Field of the Invention

The present invention relates to a processing apparatus for processing a workpiece such as a wafer and a processing method for a workpiece in which the processing apparatus is used.

Description of the Related Art

In recent years, in order to implement a device chip of a small size and a light weight, an opportunity of processing a workpiece such as a semiconductor wafer, a ceramic substrate or a resin substrate thinly by such a method as grinding or polishing is increasing. Grinding of a workpiece is performed using a grinding whetstone having abrasive grain, for example, of diamond or cubic form of boron nitride (CBN) fixed thereto by binder of resin, metal or the like. Meanwhile, for polishing of a workpiece, a polishing pad formed, for example, from unwoven fabric or foamed urethane is used. Usually, before a workpiece is ground or polished, dressing for preparing the condition of the surface (processing face) of a grinding whetstone or a polishing pad for contacting with a workpiece is performed such that the performance of the grinding whetstone or the polishing pad can be extracted sufficiently. The dressing is performed, for example, by grinding or polishing a member for adjustment called dress board (dresser board) or the like using a grinding whetstone or a polishing pad of a target (refer to, for example, Japanese Patent Laid-Open No. 2009-142906). On the other hand, if the performance of the grinding whetstone or the polishing pad drops as grinding or polishing proceeds, then a damage called scratch or the like appears on the surface of a workpiece (workpiece surface) and a process mark remains on the workpiece surface. If a process mark remains on a workpiece after processing in this manner, then dressing is performed again to recover the performance of the grinding whetstone or the polishing pad. It is to be noted that a workpiece on which a process mark remains is discarded as an unacceptable product.

SUMMARY OF THE INVENTION

However, if all of workpieces on which a process mark remains from such a reason as described above are discarded as unacceptable product, then the yield of device chips cannot be raised sufficiently. Therefore, a novel processing apparatus and a novel processing method that minimize the amount of workpieces to be discarded are demanded.

Therefore, it is an object of the present invention to provide a novel processing apparatus that can minimize the amount of workpieces to be discarded and a processing method for a workpiece in which the processing apparatus is used.

In accordance with an aspect of the present invention, there is provided a processing apparatus including a chuck table configured to hold a workpiece in the form of a plate by a holding face thereof, a processing unit configured to process the workpiece held on the chuck table with a grinding whetstone or a polishing pad, a movement unit configured to relatively move the chuck table and the processing unit in a direction parallel to the holding face, a processing feeding unit configured to relatively move the chuck table and the processing unit in a direction orthogonal to the holding face, an inspection unit configured to inspect a process mark of the workpiece during processing by the processing unit, a dressing unit configured to dress the grinding whetstone or the polishing pad of the processing unit, and a control unit configured to control the components, wherein, when a process mark of a size exceeding a threshold value is detected on the process face of the workpiece by the inspection unit, the control unit causes the processing of the workpiece to be stopped and then causes, after the grinding whetstone or the polishing pad is dressed by the dressing unit, the processing of the workpiece to be re-started.

In one mode of the present invention, preferably the chuck table is movable between a mounting-dismounting position at which the workpiece is to be mounted or dismounted and a processing position at which the workpiece is processed by the processing unit, and the dressing unit dresses the grinding whetstone or the polishing pad in a state in which the chuck table is positioned at the processing position.

Further, in the one mode of the present invention, preferably the dressing unit includes a dressing member configured to contact with the grinding whetstone or the polishing pad, and an advancement-retraction unit configured to move the dressing member toward and away from the grinding whetstone or the polishing pad.

Further, according to the one mode of the present invention, there is provided a processing method for a workpiece in which the processing apparatus described above is used, the processing method including a protective member sticking step of sticking a protective member to a surface side of a workpiece, and a processing step of detecting, while a rear face side of the workpiece held on the chuck table with the protective member interposed therebetween is processed by the grinding whetstone or the polishing pad, a process mark, which appears on the rear face of the workpiece, by the inspection unit, wherein, at the processing step, when a process mark of a size exceeding the threshold value is detected, the processing of the workpiece is stopped, and after the grinding whetstone or the polishing pad is dressed by the dressing unit, processing of the workpiece is re-started.

The processing apparatus according to the one mode of the present embodiment includes an inspection unit configured to inspect a process mark of a workpiece, a dressing unit configured to dress a grinding whetstone or a polishing pad, and a control unit configured to control the components, wherein, when a process mark of a size exceeding a threshold value is detected on a process face of the workpiece, the control unit causes processing of the workpiece to stop and causes grinding of the workpiece to be re-started after the grinding whetstone or the polishing pad is dressed. Further, the processing method for a workpiece according to the one mode of the present invention, which uses the grinding apparatus described above, includes a processing step of detecting, while the rear face side of the workpiece is ground, a process mark that may appear on the rear face of the workpiece, wherein, at the processing step, when a process mark of a size exceeding the threshold value is detected, processing of the workpiece is stopped, and processing of the workpiece is re-started after the grinding whetstone or the polishing pad is dressed by the dressing unit. Therefore, the possibility that the process mark may remain on the workpiece after processing can be suppressed low. In other words, with the processing apparatus according to the one mode of the present invention and the processing method for a workpiece in which the processing apparatus is used, the quantity of workpieces to be discarded as unacceptable products can be reduced.

The above and other objects, features and advantages of the present invention and the manner of realizing them will become more apparent, and the invention itself will best be understood, from a study of the following description and appended frames with reference to the attached drawings showing a preferred embodiment of the invention.

DETAILED DESCRIPTION OF THE PREFERRED EMBODIMENT

Figure 1:
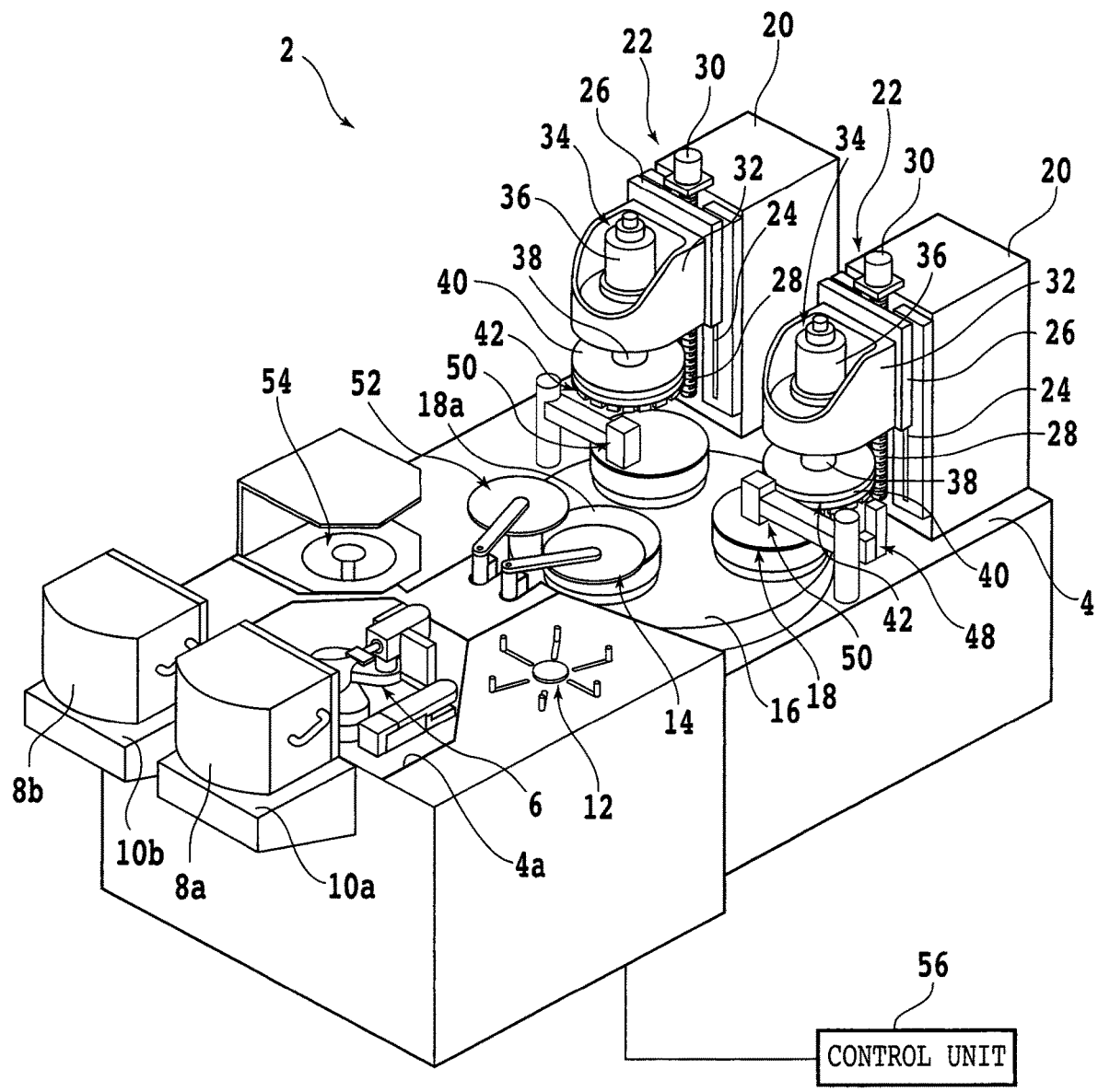
FIG. 1 is a view schematically depicting an example of a configuration of a grinding apparatus.

An embodiment according to a mode of the present invention is described with reference to the accompanying drawings. FIG. 1 is a view schematically depicting an example of a configuration of a grinding apparatus according to the present embodiment. As depicted in FIG. 1, a grinding apparatus (processing apparatus) 2 includes a base 4 that supports several structures. An opening 4a is formed at a front end side of an upper face of the base 4, and a transport mechanism 6 for transporting a workpiece 11 in the form of a plate (refer to FIG. 4A and so forth) is provided in the opening 4a. In front of the opening 4a, cassette tables 10a and 10b for receiving cassettes 8a and 8b, respectively, in which a plurality of workpieces 11 are accommodated are provided. Obliquely rearwardly of the opening 4a, a position adjustment mechanism 12 for adjusting the position of a workpiece 11 is provided. The position adjustment mechanism 12 adjusts the center of a workpiece 11 transported thereto, for example, from the cassette 8a by the transport mechanism 6 to a predetermined position. At a position adjacent the position adjustment mechanism 12, a loading mechanism 14 is provided which pivotally moves with a workpiece 11 sucked and held thereon. The loading mechanism 14 includes a suction pad for sucking an overall upper face side of a workpiece 11 and transports the workpiece 11, whose position is adjusted by the position adjustment mechanism 12, rearwardly.

Behind the loading mechanism 14, a turntable (moving unit) 16 is provided. The turntable 16 is connected to a rotational driving source (moving unit, not depicted) such as a motor and rotates around an axis of rotation extending substantially in parallel to a Z axis direction (vertical direction). On an upper face of the turntable 16, three chuck tables 18 for sucking and holding a workpiece 11 thereon are provided at substantially equal angular distances. It is to be noted that there is no limitation to the number of chuck tables 18 to be provided on the turntable 16 and so forth. The loading mechanism 14 loads a workpiece 11 sucked and held by the suction pad to the chuck table 18 disposed at a loading-unloading position (mounting and dismounting position for mounting and dismounting a workpiece 11) adjacent the loading mechanism 14. The turntable 16 rotates and moves the chuck tables 18 in order to the loading-unloading position, a rough grinding position (first processing position for processing a workpiece), and a finish grinding position (second processing position for processing a workpiece). Each chuck table 18 is connected to a rotational driving source (not depicted) such as a motor and rotates around an axis of rotation substantially parallel to the Z axis direction. Part of an upper face of each chuck table 18 is formed as a holding face 18a for sucking and holding a workpiece 11 thereon. This holding face 18a is connected to a suction source (not depicted) through a flow path (not depicted) formed in the inside of the chuck table 18. A workpiece 11 loaded on the chuck table 18 is sucked and held to the lower face side by negative pressure of the suction source acting upon the holding face 18a.

Behind the rough grinding position and the finish grinding position (behind the turntable 16), a column-like support structure 20 is provided. At the front face side of each support structure 20, a Z-axis movement mechanism (processing feeding unit) 22 is provided. Each Z-axis movement mechanism 22 includes a pair of Z-axis guide rails 24 substantially parallel to the Z axis direction, and a Z-axis movement plate 26 is mounted for sliding movement on the Z-axis guide rails 24. At the back face side (rear face side) of each of the Z-axis movement plates 26, nut portions (not depicted) are provided, and a Z-axis ball screw 28 parallel to the Z-axis guide rails 24 is screwed in the nut portions. A Z-axis stepping motor 30 is connected to one end portion of each of the Z-axis ball screws 28. By rotating the Z-axis ball screw 28 by the Z-axis stepping motor 30, the Z-axis movement plate 26 is moved in the Z axis direction along the Z-axis guide rails 24.

A fixing member 32 is provided on a front face (surface) of each of the Z-axis movement plates 26. A grinding unit (processing unit) 34 for grinding (processing) a workpiece 11 is supported on each fixing member 32. Each grinding unit 34 has a spindle housing 36 fixed to the fixing member 32. In each spindle housing 36, a spindle 38 that serves as a rotational shaft substantially parallel to the Z axis direction is accommodated in a rotatable manner. A lower end portion of each of the spindles 38 is exposed from a lower end face of the spindle housing 36. A mount 40 in the form of a disk is fixed to a lower end portion of the spindle 38. A grinding wheel 42 of a diameter substantially equal to that of the mount 40 is mounted on a lower face of the mount 40. The grinding wheel 42 includes a wheel base 44 (refer to FIG. 5A) formed from a metal material such as stainless steel or aluminum. On a lower face of the wheel base 44, a plurality of grinding whetstones 46 (refer to FIG. 5A) are arrayed annularly. In the inside or in the proximity of the grinding wheel 42, a nozzle for supplying grinding fluid (processing fluid) such as pure water to a workpiece 11 and so forth is provided.

A workpiece 11 loaded on the chuck table 18 by the loading mechanism 14 is ground by the grinding unit 34 described hereinabove. In particular, the turntable 16 is rotated first to move the chuck table 18, on which the workpiece 11 is held, to the rough grinding position or the finish grinding position. Then, in a state in which the chuck table 18 and the grinding wheel 42 are rotated relative to each other, the grinding unit 34 is lowered until the grinding whetstones 46 of the grinding wheel 42 are brought into contact with the upper face (work surface) of the workpiece 11. Consequently, the upper face side of the workpiece 11 can be ground.

Below each of the grinding units 34, a dressing unit 48 (in FIG. 1, only one at the rough grinding side is depicted) for dressing the grinding whetstones 46 of the corresponding grinding wheel 42 is provided. Further, above the chuck table 18 disposed at both the rough grinding position and the finish grinding position, an inspection unit 50 for inspecting a state of an upper face of a workpiece 11 ground by the corresponding grinding unit 34 is disposed. Details of the dressing unit 48 and the inspection unit 50 are hereinafter described.

At a position adjacent the loading mechanism 14 and the loading-unloading position, an unloading mechanism 52 that sucks and holds a workpiece 11 after grinding and pivotally moves is provided. The unloading mechanism 52 includes a suction pad for sucking an entire upper face side of a workpiece 11 and unloads the workpiece 11 after grinding from the chuck table 18 disposed at the loading-unloading position and then transports the workpiece 11 forwardly. At a position adjacent the unloading mechanism 52, a cleaning mechanism 54 for cleaning the workpiece 11 after grinding transported by the unloading mechanism 52 is provided. The workpiece 11 cleaned by the cleaning mechanism 54 is transported by the transport mechanism 6 and is loaded and accommodated, for example, into the cassette 8*b*. Further, to the components described above, a control unit 56 is connected. The control unit 56 controls operation and so forth of the components such that the workpiece 11 can be ground appropriately.

Figure 2:
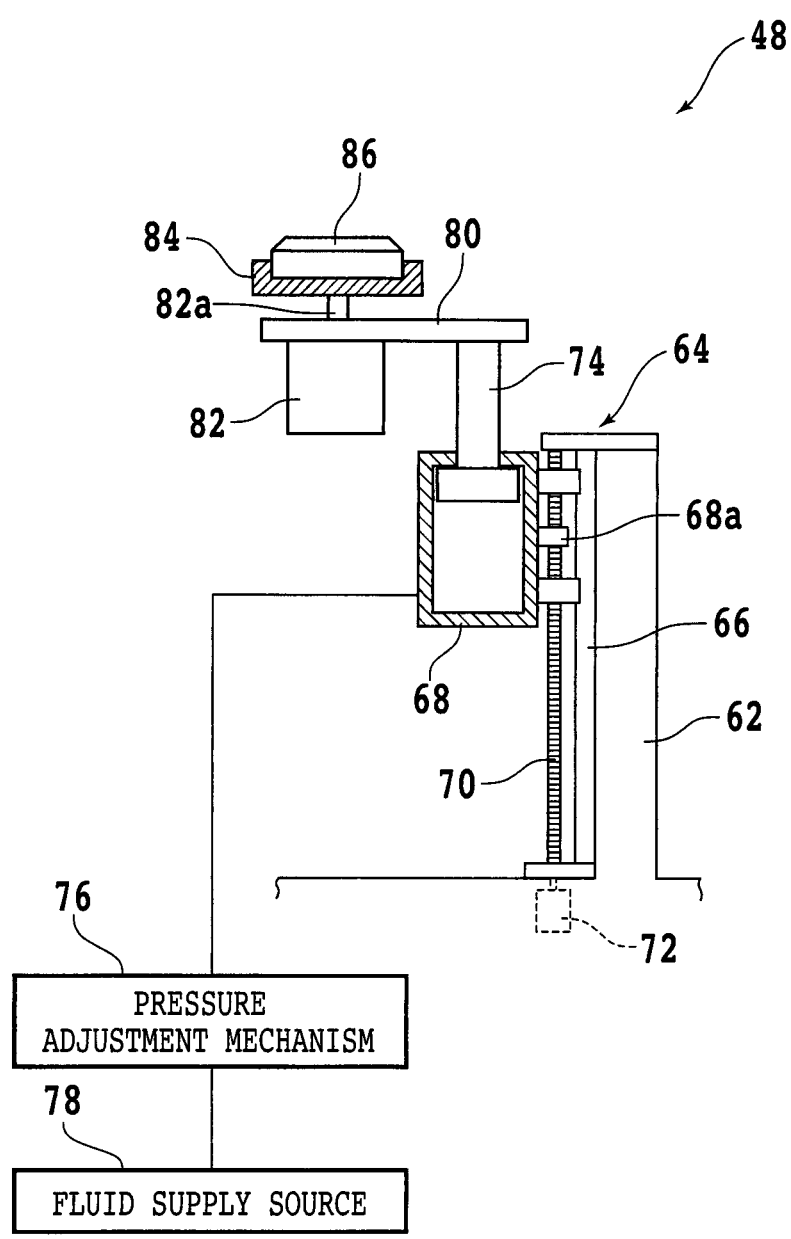
FIG. 2 is a view schematically depicting an example of a configuration of a dressing unit.

FIG. 2 is a view schematically depicting an example of a configuration of the dressing unit 48. The dressing unit 48 has a support structure 62 extending upwardly from the base 4. A Z-axis movement mechanism (advancing and retracting unit) 64 is provided on a side face of the support structure 62. The Z-axis movement mechanism 64 includes a pair of Z-axis guide rails 66 substantially parallel to the Z axis direction, and a cylinder 68 having an opening at an upper portion thereof is mounted for sliding movement on the z-axis guide rails 66. At the support structure 62 side of the cylinder 68, a nut portion 68*a* is provided, and a Z-axis ball screw 70 parallel to the Z-axis guide rails 66 is screwed in the nut portion 68*a*. A Z-axis stepping motor 72 is connected to one end portion of the Z-axis ball screw 70. By rotating the Z-axis ball screw 70 by the Z-axis stepping motor 72, the cylinder 68 moves along the Z-axis guide rails 66 in the Z axis direction.

In the opening of the cylinder 68, a lower end side of a piston rod 74 is inserted. Further, a fluid supply source 78 for supplying fluid such as air or oil through a pressure adjustment mechanism 76 or the like is connected to the cylinder 68. By adjusting the pressure of the fluid supplied from the fluid supply source 78 by the pressure adjustment mechanism 76, arbitrary upward pressure can be applied to the piston rod 74. It is to be noted that, as the pressure adjustment mechanism 76, for example, a pressure regulator or the like is used. At the upper end side of the piston rod 74, a support plate 80 having an upper face and a lower face that are substantially horizontal is connected. At the lower face side of the support plate 80, a rotational driving source 82 such as a motor is provided. The rotational driving source 82 has a rotary shaft 82*a* substantially parallel to the Z axis direction, and an upper end portion of the rotary shaft 82*a* is exposed above the support plate 80.

A holding plate 84 in the form of a disk is connected to an upper end portion of the rotary shaft 82*a*. Further, at the upper face side of the holding plate 84, a dress board (dressing member) 86 is held. Therefore, by using the Z-axis movement mechanism 64 described above, the dress board 86 can be moved in the Z axis direction to adjust the height thereof. Further, by using the cylinder 68, piston rod 74 and so forth, arbitrary upward pressure can be applied to the dress board 86. Further, by using the rotational driving source 82, the dress board 86 can be rotated around the rotary shaft 82*a*. The dress board 86 is configured using, for example, white alumina-based or green silicon carbide type abrasive grain or the like and is used such that an upper face thereof is pressed against a lower face of the grinding whetstones 46.

Figure 3:
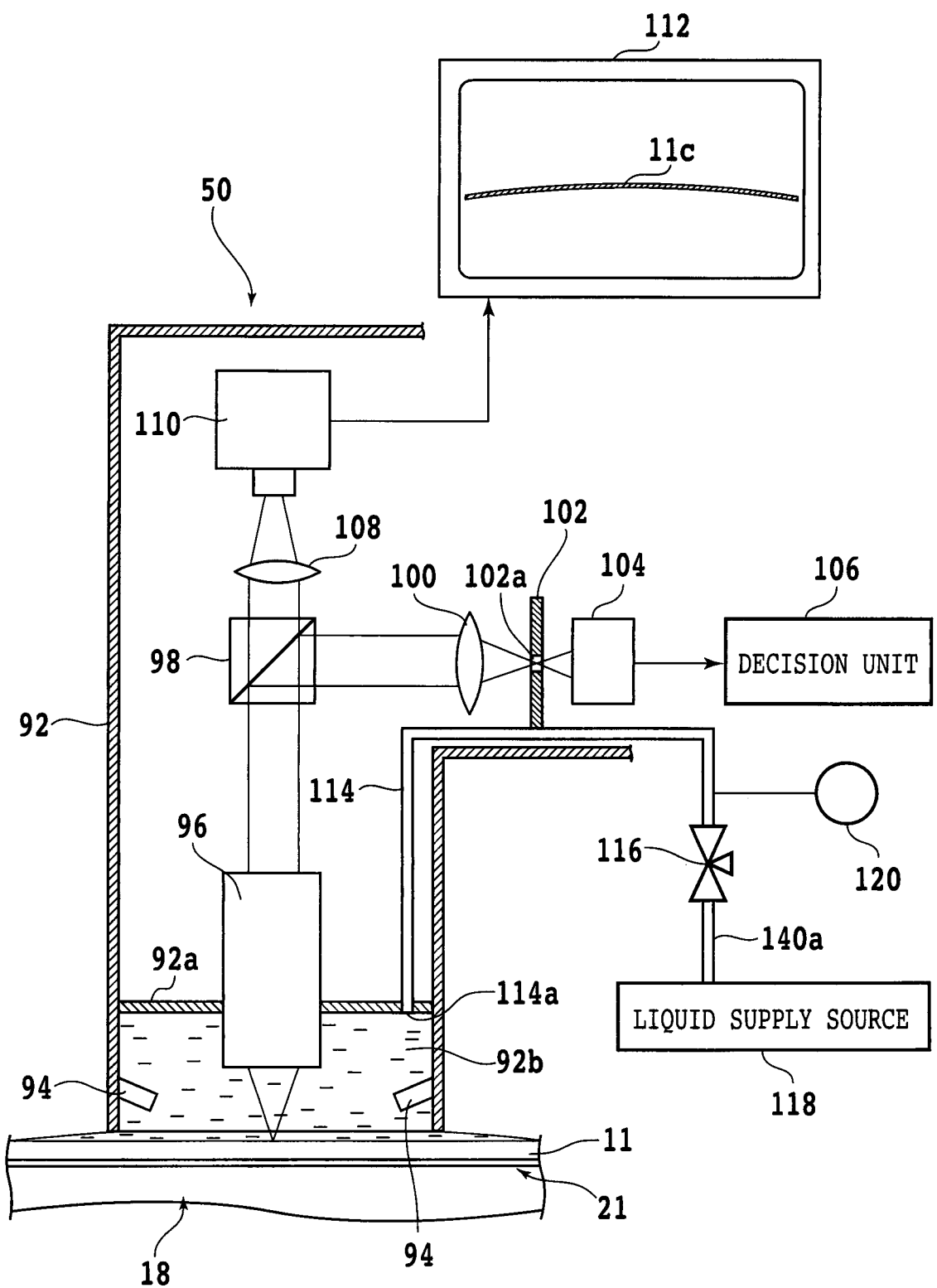
FIG. 3 is a view schematically depicting an example of an inspection unit.

FIG. 3 is a view schematically depicting an example of a configuration of the inspection unit 50. The inspection unit 50 has a tubular housing 92 having an opening at a lower end thereof. A partition wall 92*a* is provided in the housing 92 such that it partitions the internal space of the housing 92 upwardly and downwardly. The lower space of the partition wall 92*a* serves as a liquid-filled chamber 92*b* in which liquid such as pure water is filled. In the liquid-filled chamber 92*b*, a plurality of laser diodes (LDs) 94 for irradiating light in an obliquely downward direction are provided. Further, in a central region of the partition wall 92*a*, an objective lens 96 is provided which converts part of light emitted from the laser diodes 94 and scattered by the workpiece 11 into a parallel beam (collimate beam).

Above the objective lens 96, a beam splitter (half mirror) 98 is provided, and the parallel beam formed by the objective lens 96 is branched in two directions by the beam splitter 98. Sideward of the beam splitter 98, a condenser lens 100 for condensing one of the parallel beams branched by the beam splitter 98 is disposed. Further, a light shielding member 102 is disposed at a position adjacent the condenser lens 100. The light shielding member 102 has a slit 102*a* in the proximity of the focus of the condenser lens 100 and allows one of the parallel beams condensed by the condenser lens 100 to pass through the slit 102*a*. The one of the parallel beams passing through the slit 102*a* enters a light reception element 104 adjacent the light shielding member 102 and is converted, for example, into current by the light reception element 104. To the light reception element 104, a decision unit 106 is connected which decides presence or absence of a process mark of a size greater than a threshold value on the basis of the current value of the light reception element 104. A result for the decision of the decision unit 106 is sent to the control unit 56 described hereinabove. Meanwhile, above the beam splitter 98, a condenser lens 108 for condensing the other parallel beam branched by the beam splitter 98 is disposed. At a position adjacent the condenser lens 108, a camera 110 including an image pickup element such as a charge-coupled device (CCD) element is disposed. A monitor 112 is connected to the camera 110, and an image of the workpiece 11 formed by the camera 110 is displayed on the monitor 112.

To the liquid-filled chamber 92*b*, one end 114*a* of a liquid supply path 114 is connected. To the other end side of the liquid supply path 114, a liquid supply source 118 is connected through a liquid supply valve 116 or the like. By adjusting the opening of the liquid supply valve 116, the flow rate of the fluid to be supplied to the liquid-filled chamber 92b can be adjusted. To the liquid supply path 114, a pressure gauge 120 for measuring the pressure of fluid supplied through the liquid supply valve 116 is connected.

In the inspection unit 50 configured in such a manner as described above, since the space between the workpiece 11 and the objective lens 96 can be filled with fluid such as pure water, a process mark can be detected without being influenced by the grinding fluid supplied during grinding of the workpiece 11. If a process mark of a size exceeding the threshold value (for example, a size with which the workpiece 11 is determined as an unacceptable product) is detected by the inspection unit 50, then the control unit 56 stops grinding of the workpiece 11 and controls the dressing unit 48 to dress the grinding whetstones 46. Thereafter, the control unit 56 causes grinding of the workpiece 11 to be re-started.

Figure 4A:
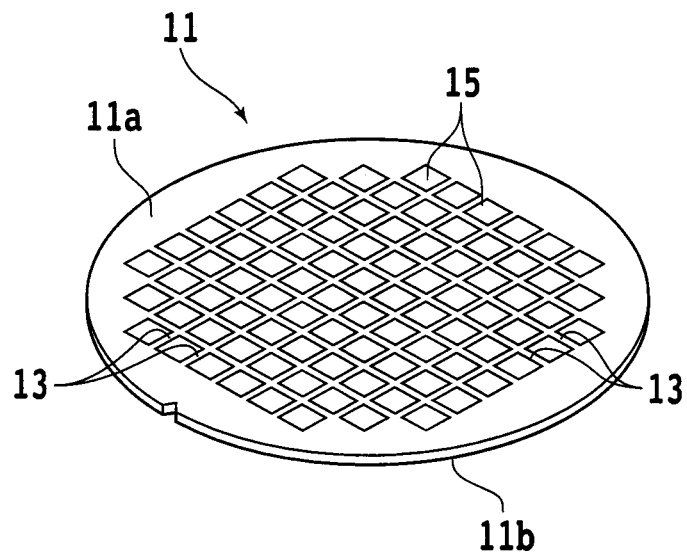
FIG. 4A is a perspective view schematically depicting an example of a configuration of a workpiece.

Now, a processing method for a workpiece performed using the grinding apparatus 2 described above is described. FIG. 4A is a perspective view schematically depicting an example of a configuration of a workpiece 11 processed by the processing method for a workpiece according to the present embodiment. As depicted in FIG. 4A, the workpiece 11 is, for example, a wafer formed in the shape of a disk using a semiconductor material such as silicon (Si). A surface 11a side of the workpiece 11 is partitioned into a plurality of regions by scheduled division lines (streets) 13 arrayed in a grid pattern, and a device 15 such as an integrated circuit (IC) or a large-scale integration (LSI) is formed in each region. It is to be noted that, while, in the present embodiment, a disk-shaped wafer made of a semiconductor material such as silicon is used as the workpiece 11, the workpiece 11 is not limited in terms of the material, shape, structure, size and so forth. For example, a substrate formed from a ceramic material, a resin material, a metal material or the like may be used as the workpiece 11. Similarly, the device 15 is not limited at all in terms of the type, quantity, size, arrangement and so forth. Further, a wafer, a substrate or the like on which no device 15 is formed may be used as the workpiece 11.

Figure 4B:
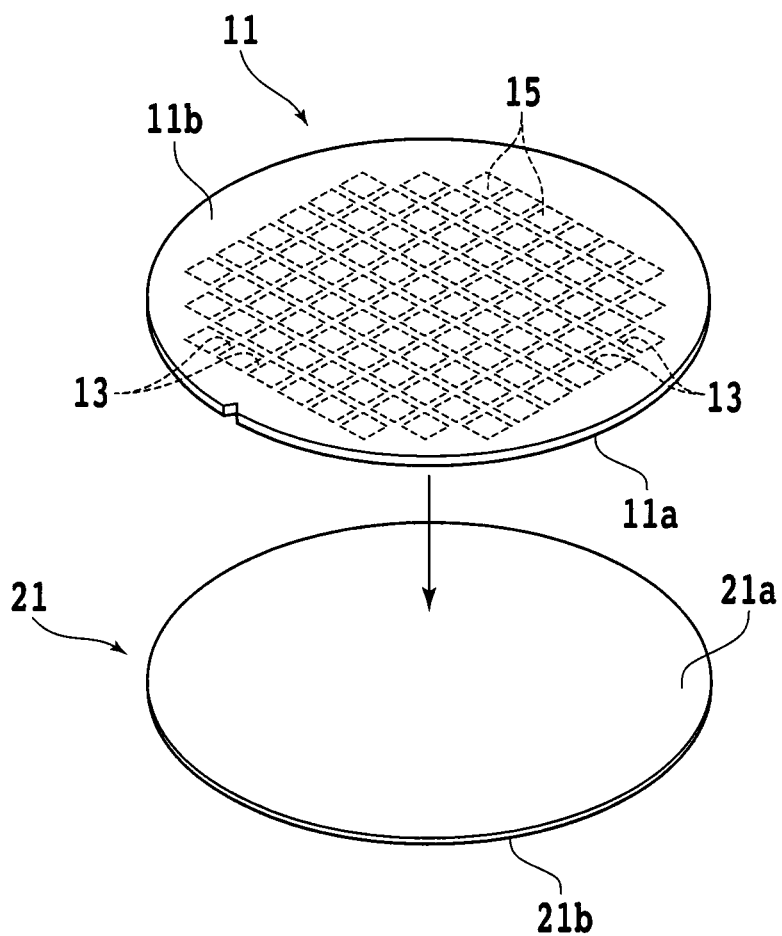
FIG. 4B is a perspective view illustrating a protective member sticking step.

In the processing method for a workpiece according to the present embodiment, a protective member sticking step of sticking (pasting) a protective member to the surface 11a side of the workpiece 11 described hereinabove is performed first. FIG. 4B is a perspective view illustrating the protective member sticking step. A protective member 21 is, for example, a tape (film), a resin substrate, a wafer of a type same as or different from that of the workpiece 11, a substrate or the like of a circular shape having a diameter substantially equal to that of the workpiece 11, and a paste layer having adhesive force is provided at a surface 21a side of the protective member 21. Therefore, by causing the surface 21a side of the protective member 21 to closely contact with the surface 11a side of the workpiece 11 as depicted in FIG. 4B, the protective member 21 can be stuck to the surface 11a side of the workpiece 11. By sticking the protective member 21 to the surface 11a side of the workpiece 11, it is possible to moderate an impact to be applied at a later processing step to protect the device 15 and so forth formed on the surface 11a of the workpiece 11.

Figure 5A:
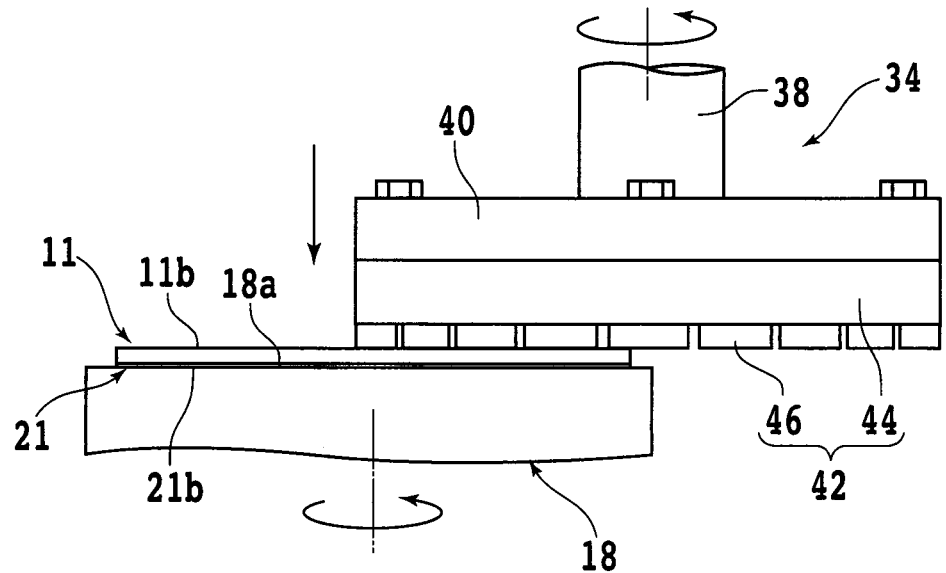
FIG. 5A is a side elevational view illustrating a processing step.

After the protective member sticking step, a processing step for processing the workpiece 11 is performed. FIG. 5A is a side elevational view illustrating the processing step. At the processing step, the workpiece 11 to which the protective member 21 is stuck is held by the chuck table 18 positioned at the loading-unloading position. In particular, a rear face 21b of the protective member 21 stuck to the workpiece 11 is brought into contact with the holding face 18a of the chuck table 18 and negative pressure of the suction source is applied. Consequently, the workpiece 11 is sucked to and held on the chuck table 18 in a state in which a rear face lib side thereof is exposed upwardly. In particular, in the present embodiment, the rear face 11b of the workpiece 11 is an upper face (processing face), and the surface 11a of the workpiece 11 is a lower face.

After the workpiece 11 is sucked and held by the chuck table 18, the turntable 16 is rotated to move the chuck table 18 from the loading-unloading position to the rough grinding position. In particular, the chuck table 18 and the grinding unit 34 are relatively moved in a direction substantially parallel to the holding face 18a until the workpiece 11 is disposed below the grinding wheel 42 for rough grinding. Further, the chuck table 18 and the grinding wheel 42 are rotated to lower the spindle housing 36 as depicted in FIG. 5A while grinding fluid is supplied from the nozzle. In particular, the chuck table 18 and the grinding unit 34 are relatively moved in a direction substantially perpendicular (in an orthogonal direction) to the holding face 18a. The lowering speed (lowering rate) of the spindle housing 36 is set to such a degree that the lower face of the grinding whetstones 46 are pressed against the rear face 11b of the workpiece 11. Consequently, the rear face 11b can be ground roughly (rough grinding) thereby to make the workpiece 11 thinner. This rough grinding is continued, for example, until the thickness of the workpiece 11 becomes a predetermined thickness.

After the rough grinding, the turntable 16 is further rotated until the chuck table 18 is moved from the rough grinding position to the finish grinding position. In particular, the chuck table 18 and the grinding unit 34 are relatively moved in a direction substantially parallel to the holding face 18a until the workpiece 11 is disposed below the grinding wheel 42 for finish grinding. Then, finish grinding is performed in a procedure similar to that in the rough grinding. It is to be noted that, while, in the present embodiment, the workpiece 11 is ground at two stages of rough grinding and finish grinding, also it is possible to grind the workpiece 11 at one state or at multiple stages equal to or greater than three stages.

Figure 5B:
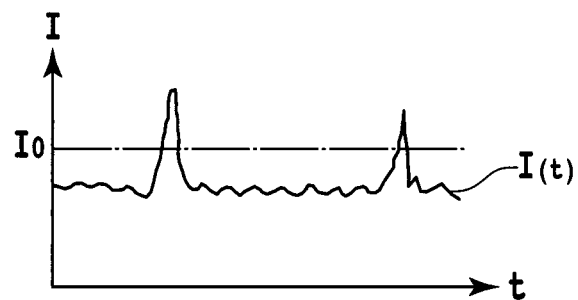
FIG. 5B is a graph depicting an example of a relationship (I(t)) between current (I) and time (t) obtained on a light reception element.
Figure 5C:
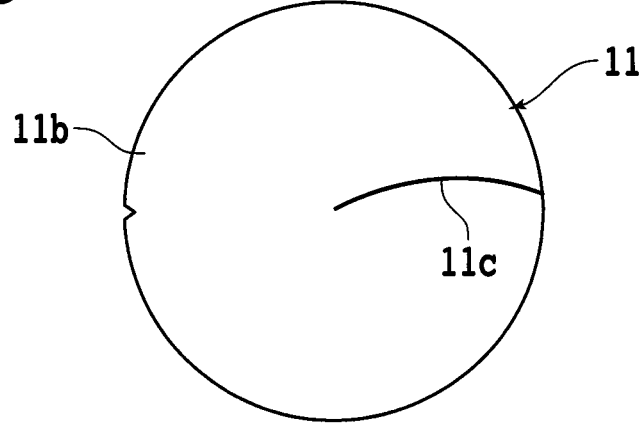
FIG. 5C is a plan view schematically depicting an example of a process mark formed on a rear face of a workpiece.

At the processing step of the present embodiment, a process mark that appears on the rear face 11b of the workpiece 11 during grinding of the workpiece 11 described above is detected by the inspection unit 50. In particular, for example, the inspection unit 50 is adjusted to a region of the workpiece 11 that becomes an inspection target and the liquid-filled chamber 92b is filled with fluid, and the intensity of light (current value) irradiated from the plurality of laser diodes 94 and scattered by the rear face 11b of the workpiece 11 is measured by the light reception element 104. FIG. 5B is a graph depicting an example of a relationship (I(t)) between the current value (I) obtained on the light reception element 104 and time (t). FIG. 5C is a plan view schematically depicting an example of a process mark formed on the rear face 11b of the workpiece 11. The intensity of light scattered by the workpiece 11 usually increases as the size of a process mark 11c increases. In particular, also the current value (I) obtained by the light reception element 104 increases as the process mark 11c increases. Therefore, by comparing the current (I) obtained on the light reception element 104 with an arbitrary threshold value ($I_0$) as depicted in FIG. 5B, presence or absence of a process mark 11c of a size corresponding to the threshold value ($I_0$) can be decided. The decision unit 106 decides that a process mark 11c of a size exceeding the threshold value (for example, a size with which the workpiece 11 is determined as an unacceptable product) exists, for example, when the current (I) exceeds the threshold value ($I_0$) (or is equal to or greater than the threshold value ($I_0$)). On the other hand, for example, when the current (I) is equal to or lower than the threshold value ($I_0$) (or is lower than the threshold value ($I_0$)), the decision unit 106 decides that a process mark 11c of a size exceeding the threshold value does not exist. If it is decided that a process mark 11c of a size exceeding the threshold value exists, then the control unit 56 causes the grinding of the workpiece 11 to be stopped (namely, stops the lowering of the spindle housing 36) and controls the dressing unit 48 described hereinabove to perform dressing of the grinding whetstones 46.

Figure 6A:
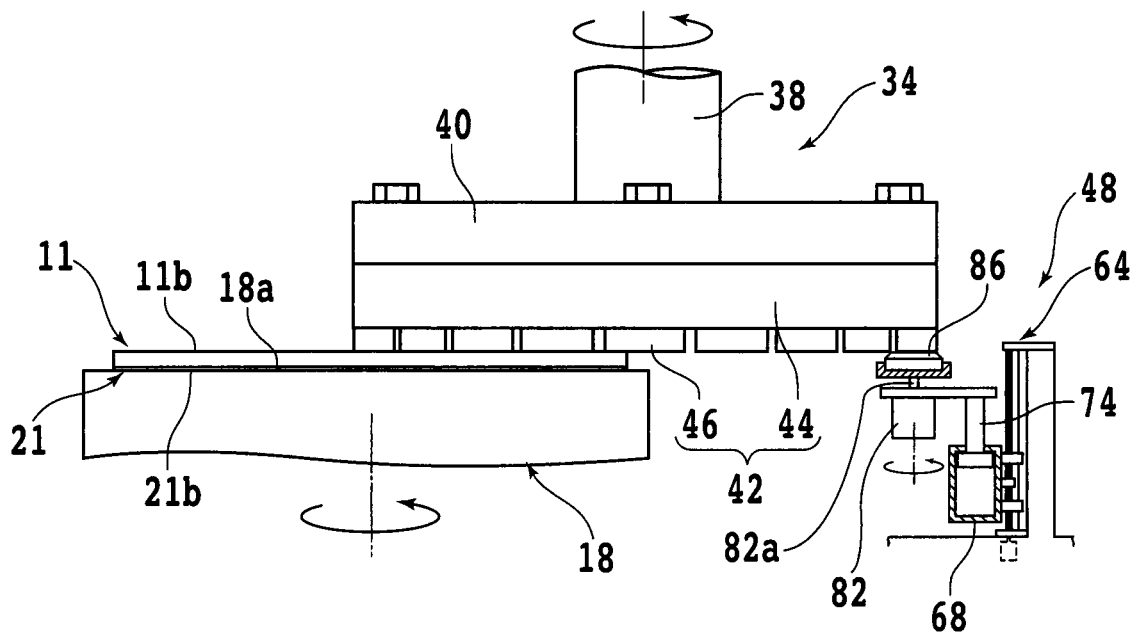
FIG. 6A is a side elevational view illustrating dressing performed at the processing step.

FIG. 6A is a side elevational view illustrating dressing performed at the processing step. When dressing of the grinding whetstones 46 is to be performed, for example, the Z-axis movement mechanism 64 is used to upwardly move (advance) the dress board 86 to a height at which the dress board 86 can contact with the grinding whetstones 46. It is to be noted here that the height of the grinding wheel 42 is not changed and the grinding wheel 42 is kept in a rotating state. Meanwhile, rotation of the chuck table 18 may be maintained or may be stopped. Further, the rotational driving source 82 is used to rotate the dress board 86 around the rotary shaft 82a. Then, using the cylinder 68, piston rod 74 or the like, the upper face of the dress board 86 is pressed against the lower face of the grinding whetstones 46. Consequently, the grinding whetstones 46 can be dressed with the upper face of the dress board 86 contacted with the lower face of the grinding whetstones 46. It is to be noted that the speed of rotation of the grinding wheel 42 or the dress board 86 is adjusted within a range within which the grinding whetstones 46 can be addressed appropriately.

After the dressing of the grinding whetstones 46 is completed, the control unit 56 controls the Z-axis movement mechanism 64 to lower (retract) the dress board 86 and then causes grinding of the workpiece 11 to be re-started. Completion of the dressing is decided by the control unit 56, for example, on the basis of the abrasion amount of the grinding whetstones 46 or the dress board 86, the processing time period (elapsed time period) for dressing and so forth. In the present embodiment, since dressing is performed without changing the height of the grinding wheel 42 as described above, grinding of the workpiece 11 can be re-started rapidly. It is to be noted that, in a situation in which the workpiece 11 is thinned sufficiently by grinding or the like and grinding cannot be continued to such a degree that the process mark 11c can be removed, it is preferable not to re-start grinding of the workpiece 11. In this case, although the workpiece 11 is discarded as an unacceptable product, since useless grinding need not be performed, the productivity does not drop.

As described above, the grinding apparatus (processing apparatus) 2 according to the present embodiment includes an inspection unit 50 configured to inspect a process mark 11c of a workpiece 11, a dressing unit 48 configured to dress a grinding whetstone 46, and a control unit 56 configured to control the components, and wherein, when a process mark 11c of a size exceeding a threshold value is detected on a rear face 11b (upper face, process face) of the workpiece 11, the control unit 56 causes grinding (processing) of the workpiece 11 to be stopped and causes grinding of the workpiece 11 to be re-started after the grinding whetstone 46 is dressed. Further, a processing method for a workpiece that uses the grinding apparatus 2 includes a processing step of detecting, while the rear face 11b side of the workpiece 11 is ground, a process mark 11c that may appear on the rear face 11b of the workpiece 11, and wherein, at the processing step, when a process mark 11c of a size exceeding the threshold value is detected, processing of the workpiece 11 is stopped, and processing of the workpiece 11 is re-started after the grinding whetstone 46 is dressed by the dressing unit 48. Therefore, the possibility that the process mark 11c may remain on the workpiece 11 after processing can be suppressed low. In other words, the quantity of workpieces 11 to be discarded as unacceptable products can be reduced.

Figure 6B:
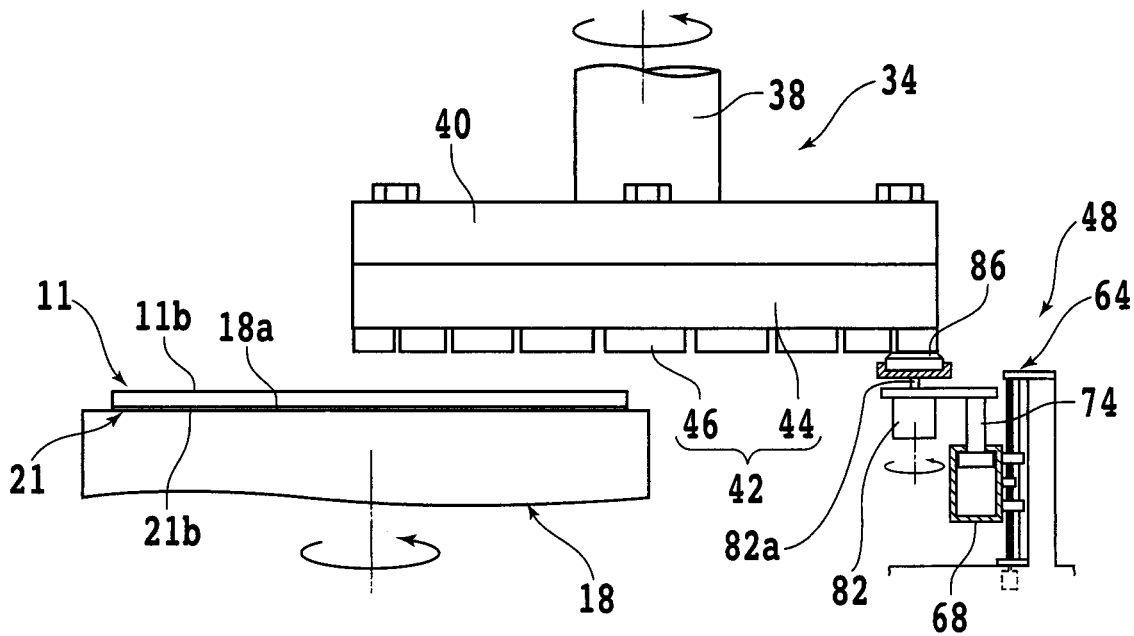
FIG. 6B is a side elevational view illustrating dressing according to a modification.

It is to be noted that the present invention can be carried out in various modified forms without being restricted by the description of the present embodiment. For example, while, in the embodiment described above, dressing is performed without changing the height of the grinding wheel 42, dressing may otherwise be performed after the grinding wheel 42 is moved upwardly. FIG. 6B is a side elevational view illustrating the dressing according to the modification. By performing dressing after the grinding wheel 42 is moved upwardly in this manner, contact or interference between the workpiece 11 and the grinding whetstones 46 during dressing can be prevented.

Further, while, in the embodiment described above, the grinding apparatus 2 is exemplified as an example of the processing apparatus, the processing apparatus of the present invention may otherwise be a polishing apparatus or the like. In the polishing apparatus, for example, a polishing unit (processing unit) having a polishing pad mounted thereon is used in place of the grinding unit 34 mounted thereon the grinding wheel 42 (grinding whetstones 46).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus, comprising:
    a chuck table configured to hold a workpiece in the form of a plate by a holding face thereof;
    a processing unit configured to process the workpiece held on the chuck table with a grinding whetstone or a polishing pad;
    a movement unit configured to relatively move the chuck table and the processing unit in a direction parallel to the holding face;
    a processing feeding unit configured to relatively move the chuck table and the processing unit in a direction orthogonal to the holding face;
    an inspection unit configured to inspect a process mark caused by earlier processing of the workpiece during processing by the processing unit to determine whether the grinding whetstone or the polishing pads needs to be dressed;
    a dressing unit configured to dress the grinding whetstone or the polishing pad of the processing unit; and
    a control unit configured to control the processing unit, the movement unit, the processing feeding unit, the inspection unit and the dressing unit, wherein,
    responsive to a determination that a process mark caused by earlier processing of the workpiece by the processing unit of a size exceeding a threshold value has been detected on the process face of the workpiece by the inspection unit, the control unit causes the processing of the workpiece to be temporarily stopped and then causes, after the grinding whetstone or the polishing pad is dressed by the dressing unit, the processing of the workpiece to be re-started.

2. The processing apparatus according to claim 1, wherein the chuck table is movable between a mounting-dismounting position at which the workpiece is to be mounted or dismounted and a processing position at which the workpiece is processed by the processing unit, and the dressing unit dresses the grinding whetstone or the polishing pad in a state in which the chuck table is positioned at the processing position.

3. The processing apparatus according to claim 1, wherein the dressing unit includes a dressing member configured to contact with the grinding whetstone or the polishing pad, and an advancement-retraction unit configured to move the dressing member toward and away from the grinding whetstone or the polishing pad.

4. The processing apparatus according to claim 1, wherein the inspection unit comprises:

a liquid-filled chamber;

a plurality of laser diodes configured and arranged to irradiate light through the liquid-filled chamber toward the workpiece;

an objective lens configured and arranged to receive light originating from the laser diodes and then reflected from the workpiece; and a light reception element for turning light passed through the objective lens into current to be used for determining whether a process mark has exceeded the threshold value.

5. The processing apparatus according to claim 1, wherein the process mark comprises a scratch.

6. The processing apparatus according to claim 1, wherein the inspection unit comprises:

a plurality of laser diodes configured and arranged to irradiate light toward the workpiece;

an objective lens configured and arranged to receive light originating from the laser diodes and then reflected from the workpiece; and a light reception element for turning light passed through the objective lens into current to be used for determining whether a process mark has exceeded the threshold value.

7. The processing apparatus according to claim 1, wherein the threshold value is based on a size of a process mark at which the workpiece is considered to be an unacceptable product.

8. A processing method for a workpiece in which a processing apparatus is used, the processing apparatus including a chuck table configured to hold a workpiece in the form of a plate by a holding face thereof, a processing unit configured to process the workpiece held on the chuck table with a grinding whetstone or a polishing pad, a movement unit configured to relatively move the chuck table and the processing unit in a direction parallel to the holding face, a processing feeding unit configured to relatively move the chuck table and the processing unit in a direction orthogonal to the holding face, an inspection unit configured to inspect a process mark caused by earlier processing of the workpiece during processing by the processing unit, a dressing unit configured to dress the grinding whetstone or the polishing pad of the processing unit, and a control unit configured to control the processing unit, the movement unit, the processing feeding unit, the inspection unit, and the dressing unit, in which, when a process mark caused by earlier processing of a size exceeding a threshold value is detected on the process face of the workpiece by the inspection unit, the control unit causes the processing of the workpiece to be stopped and then causes, after the grinding whetstone or the polishing pad is dressed by the dressing unit, the processing of the workpiece to be re-started, the processing method comprising:

a protective member sticking step of sticking a protective member to a surface side of a workpiece; and a processing step of detecting, while a rear face side of the workpiece held on the chuck table with the protective member interposed therebetween is processed by the grinding whetstone or the polishing pad, a process mark, which appears on the rear face of the workpiece, by the inspection unit, at the processing step, responsive to a determination that the grinding whetstone or the polishing pad needs to be dressed because it has been determined that a size of a process mark exceeds the threshold value, the processing of the workpiece is stopped, and after the grinding whetstone or the polishing pad is dressed by the dressing unit, processing of the workpiece is re-started.

9. The processing method according to claim 8, wherein the process mark comprises a scratch.

10. The processing method according to claim 8, wherein the threshold value is based on a size of a process mark at which the workpiece is considered to be an unacceptable product.

11. A processing method for a workpiece in which a processing apparatus is used, the processing apparatus including a chuck table configured to hold a workpiece in the form of a plate by a holding face thereof, a processing unit configured to process the workpiece held on the chuck table with a grinding whetstone or a polishing pad, a movement unit configured to relatively move the chuck table and the processing unit in a direction parallel to the holding face, a processing feeding unit configured to relatively move the chuck table and the processing unit in a direction orthogonal to the holding face, an inspection unit configured to inspect a process mark of the workpiece during processing by the processing unit, a dressing unit configured to dress the grinding whetstone or the polishing pad of the processing unit, and a control unit configured to control the processing unit, the movement unit, the processing feeding unit, the inspection unit and the dressing unit, the processing method comprising:

a protective member sticking step of sticking a protective member to a surface side of a workpiece; and a processing step of detecting, while a rear face side of the workpiece held on the chuck table with the protective member interposed therebetween is processed by the grinding whetstone or the polishing pad, a scratch caused during processed by the grinding whetstone or the polishing pad, which appears on the rear face of the workpiece, by the inspection unit, responsive to a determination that the grinding whetstone or the polishing pad needs to be dressed, based on the processing step of detecting, that a scratch of a size exceeding a threshold value has been detected, the following steps are performed:

a stopping step of the stopping the processing of the workpiece by the processing unit;

a dressing step of dressing the grinding whetstone or the polishing pad by the dressing unit; and a re-starting step of re-starting the processing of the workpiece by the processing unit after performing the dressing step.

12. The processing method according to claim 11, wherein the threshold value is based on a size of a scratch at which the workpiece is considered to be an unacceptable product.

* * * * *